(12) United States Patent
Choi et al.

(10) Patent No.: US 10,490,558 B2
(45) Date of Patent: Nov. 26, 2019

(54) REDUCING OR AVOIDING MECHANICAL STRESS IN STATIC RANDOM ACCESS MEMORY (SRAM) STRAP CELLS

(71) Applicant: QUALCOMM Incorporated, San Diego, CA (US)

(72) Inventors: Youn Sung Choi, San Diego, CA (US); Samit Sengupta, San Diego, CA (US); Shashank Ekbote, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 6 days.

(21) Appl. No.: 15/609,505

(22) Filed: May 31, 2017

(65) Prior Publication Data

US 2018/0350819 A1 Dec. 6, 2018

(51) Int. Cl.
*H01L 27/11* (2006.01)
*H01L 27/092* (2006.01)
(Continued)

(52) U.S. Cl.
CPC ...... *H01L 27/1104* (2013.01); *H01L 23/5226* (2013.01); *H01L 23/5286* (2013.01);
(Continued)

(58) Field of Classification Search
CPC .. H01L 27/0928; H01L 27/1104; H01L 27/11; H01L 2924/1437
See application file for complete search history.

(56) References Cited

U.S. PATENT DOCUMENTS 4,648,175 A * 3/1987 Metz, Jr. ........... H01L 21/28525
257/742
6,285,088 B1 9/2001 Madan
(Continued)

FOREIGN PATENT DOCUMENTS

EP 2551905 A2 1/2013

OTHER PUBLICATIONS

Lee, Jim et al., "Cu concentration from backside contamination induced STI crack after high temperature stress," 2015 IEEE 22nd International Symposium on the Physical and Failure Analysis of Integrated Circuits, 2015, IEEE, pp. 443-446.
(Continued)

*Primary Examiner* — Allen L Parker
*Assistant Examiner* — Gustavo G Ramallo
(74) *Attorney, Agent, or Firm* — W&T/Qualcomm

(57) ABSTRACT

Aspects for reducing or avoiding mechanical stress in static random access memory (SRAM) strap cells are disclosed herein. An exemplary SRAM strap cell includes a P-type doped well (Pwell) tap electrically coupled to a first supply rail to distribute a first supply voltage to a Pwell region of corresponding SRAM bit cell rows. The SRAM strap cell also includes an N-type doped well (Nwell) tap electrically coupled to a second supply rail to distribute a second supply voltage to an Nwell region of corresponding SRAM bit cell rows. In one exemplary aspect, the Nwell tap can include multiple supply contacts used to couple the second supply rail to the SRAM strap cell to reduce mechanical stress in the Nwell tap. In another exemplary aspect, the Pwell tap can include non-active gates disposed across multiple Fins to stabilize the Fins and reduce or avoid mechanical stress in the Pwell tap.

14 Claims, 10 Drawing Sheets

(51) Int. Cl.
*H01L 23/522* (2006.01)
*H01L 23/528* (2006.01)
*H01L 23/532* (2006.01)
*H01L 23/00* (2006.01)
*H01L 29/10* (2006.01)
*H01L 29/49* (2006.01)

(52) U.S. Cl.
CPC ...... *H01L 23/53257* (2013.01); *H01L 23/562* (2013.01); *H01L 27/0924* (2013.01); *H01L 27/0928* (2013.01); *H01L 29/1095* (2013.01); *H01L 29/4916* (2013.01); *H01L 2924/1437* (2013.01)

(56) References Cited

U.S. PATENT DOCUMENTS

| | | | |
|---|---|---|---|
| 8,373,235 B2* | 2/2013 | Masuoka | H01L 27/0886 257/368 |
| 8,891,287 B2 | 11/2014 | Seshadri et al. | |
| 9,406,681 B2 | 8/2016 | Liaw | |
| 9,558,809 B1 | 1/2017 | Liaw | |
| 2003/0122160 A1* | 7/2003 | Houston | H01L 27/1104 257/207 |
| 2009/0256199 A1* | 10/2009 | Denison | H01L 29/0653 257/343 |
| 2011/0235407 A1* | 9/2011 | Lim | H01L 27/11 365/156 |
| 2013/0141962 A1* | 6/2013 | Liaw | G11C 11/412 365/154 |
| 2013/0335875 A1* | 12/2013 | Baumann | G11C 5/005 361/111 |
| 2014/0291807 A1* | 10/2014 | Ariyoshi | H01L 21/823892 257/544 |
| 2017/0032835 A1 | 2/2017 | Liaw | |

OTHER PUBLICATIONS

Invitation to Pay Additional Fees and Partial International Search Report for PCT/US2018/034875, dated Aug. 9, 2018, 14 pages.
International Search Report and Written Opinion for PCT/US2018/034875, dated Oct. 2, 2018, 18 pages.

* cited by examiner

REDUCING OR AVOIDING MECHANICAL STRESS IN STATIC RANDOM ACCESS MEMORY (SRAM) STRAP CELLS

BACKGROUND

I. Field of the Disclosure

The technology of the disclosure relates generally to static random access memory (SRAM) strap cells, and more particularly to reducing mechanical stress in SRAM strap cells.

II. Background

Processor-based computer systems include memory for data storage. Different types of memory exist, each possessing certain unique features. For example, static random access memory (SRAM) is a type of memory that can be employed in processor-based computer systems. SRAM can store data without the need to periodically refresh the memory, unlike dynamic random access memory (DRAM) for example. An SRAM contains a plurality of SRAM bit cells (also referred to as "bit cells") organized in rows and columns in an SRAM data array. For any given row in an SRAM data array, each column of the SRAM data array includes an SRAM bit cell in which a single data value or bit is stored. Memory read and write operations are performed on a particular SRAM bit cell using read and write word lines that correspond to the SRAM bit cell row that includes the particular SRAM bit cell. In this manner, in response to a read word line activating an access transistor corresponding to an SRAM bit cell during a read operation, the SRAM bit cell asserts the data value stored in the SRAM bit cell onto a bit line while a complement of the data value is asserted onto a complement bit line. A voltage differential of the bit line and the complement bit line can be sensed to read the data value. Further, in response to a write word line activating an access transistor corresponding to an SRAM bit cell during a write operation, the data values asserted on the corresponding bit line and complement bit line are written into the selected SRAM bit cell.

A substrate of each SRAM bit cell in an SRAM data array is coupled to either a positive or negative supply voltage source that provides a respective positive or negative supply voltage (e.g., Vdd and Vss) so as to control a threshold voltage of each transistor in each SRAM bit cell. However, individually connecting the substrate of each SRAM bit cell to the positive and negative supply voltage sources can result in uneven charge distribution throughout the SRAM data array based on the varying distance from the power sources to each respective SRAM bit cell. These uneven charge distributions lead to unreliable data storage, as the charge received by the substrate of some SRAM bit cells may affect the threshold voltage of corresponding transistors so as to unintentionally change the stored value in the SRAM bit cells.

Thus, to distribute charge more evenly throughout an SRAM data array, a particular number of SRAM bit cell rows are connected to a corresponding row of SRAM strap cells. More specifically, an SRAM strap cell does not store a data value, but rather is designed to distribute charge from power sources to the SRAM bit cells in an SRAM data array. For example, each SRAM strap cell row may correspond to sixty-four (64) particular SRAM bit cell rows. Each SRAM strap cell in each SRAM strap cell row includes N-type doped material regions and P-type doped material regions. In this manner, the N-type doped and P-type doped material regions of each SRAM strap cell are coupled to an N-type and P-type substrate of the corresponding SRAM bit cells, respectively. The N-type doped material regions are coupled to a positive voltage source and the P-type doped material regions are coupled to a negative voltage source. Coupling the voltage sources to the SRAM strap cell in this manner results in the substrate of the corresponding SRAM bit cell row having a more uniform charge distribution, such that the threshold voltages of the corresponding transistors in the SRAM bit cells are more uniform. In other words, charge from the positive and negative voltage sources is distributed more evenly throughout the SRAM data array, which increases the reliability of data storage.

Although SRAM strap cells can improve charge distribution and storage reliability in an SRAM data array, mechanical stress in conventional SRAM strap cells can result in erroneous operation of an SRAM. More specifically, fabricating conventional SRAM strap cells includes exposing the corresponding die to temperatures exceeding 150 degrees Celsius (C). However, it has been observed that portions of an SRAM strap cell suffer from relatively high levels of mechanical stress under such temperature conditions. The mechanical stress can create stress fields within the die, which allows Copper (Cu) to diffuse (i.e., stress-induced diffusion) from the backside of the die so as to create electrical shorts in the SRAM strap cell. The electrical shorts prevent the SRAM strap cell from correctly powering the SRAM bit cells, thus causing errors in the stored data. Therefore, it would be advantageous to employ SRAM strap cells that provide more even charge distribution while avoiding mechanical stress-induced electrical shorts.

SUMMARY OF THE DISCLOSURE

Aspects disclosed in the detailed description include reducing or avoiding mechanical stress in static random access memory (SRAM) strap cells. For example, SRAM strap cells are employed in an SRAM to evenly distribute charge from power sources to SRAM bit cells. An exemplary SRAM strap cell includes a P-type doped well (Pwell) tap electrically coupled to a first supply rail so as to distribute a first supply voltage (e.g., ground) from the first supply rail to a Pwell region of corresponding SRAM bit cell rows. The SRAM strap cell also includes an N-type doped well (Nwell) tap electrically coupled to a second supply rail so as to distribute a second supply voltage (e.g., Vdd) from the second supply rail to an Nwell region of corresponding SRAM bit cell rows. Although SRAM strap cells can improve charge distribution and storage reliability in an SRAM data array, mechanical stress in conventional SRAM strap cells can result in erroneous operation of an SRAM. For example, mechanical stress in conventional SRAM strap cells can result in stress fields forming in a die on which the SRAM strap cells are fabricated that allows Copper (Cu) to diffuse (i.e., stress-induced diffusion) from the backside of the die so as to create electrical shorts in the SRAM strap cell, which causes errors in the stored data.

Thus, in exemplary aspects disclosed herein, to reduce or avoid the mechanical stress of an SRAM strap cell so as to prevent stress fields within a die on which the SRAM strap cell is fabricated, the Nwell tap of an SRAM strap cell can include multiple supply contacts used to couple the second supply rail to the SRAM strap cell. Employing multiple supply contacts in the Nwell tap can reduce mechanical stress (e.g., tensile stress) in the Nwell tap attributable to the supply contacts compared to a conventional supply contact formed as a single metal line running across the Nwell tap.

In another exemplary aspect that employs Fin Field-Effect Transistor (FET) (FinFET) technology for transistors in SRAM bit cells, the Pwell tap of the SRAM strap cell can include supply contacts disposed over corresponding Fins associated with Pwell regions. To reduce or avoid mechanical stress associated with the Fins of the SRAM strap cell so as to prevent stress fields in the die as described above, the Pwell tap can also include non-active gates disposed across two or more Fins so as to stabilize the Fins and reduce or avoid mechanical stress in the Pwell tap.

Additionally, in another exemplary aspect, an SRAM strap cell may include multiple supply contacts in the Nwell tap, as well as non-active gates in the Pwell tap to reduce or avoid mechanical stress in the SRAM strap cell so as to prevent stress fields in the die as described above. Preventing such stress fields from forming in the die can prevent Copper (Cu) diffusion from the backside of the die, which avoids corresponding electrical shorts in the SRAM strap cell. In this manner, the SRAM strap cell is designed to provide more even charge distribution while avoiding mechanical stress-induced electrical shorts.

In this regard in one aspect, an SRAM strap cell is provided. The SRAM strap cell comprises a substrate, a Pwell tap, and an Nwell tap. The Pwell tap comprises a plurality of Pwell regions each comprising a portion of the substrate doped with a P-type material, and a plurality of supply contacts each electrically coupled to a corresponding Pwell region of the plurality of Pwell regions and a first supply rail. The Nwell tap comprises a plurality of Nwell regions each comprising a portion of the substrate doped with an N-type material, and a plurality of supply contacts each electrically coupled to a corresponding Nwell region of the plurality of Nwell regions and a second supply rail.

In another aspect, an SRAM data array is provided. The SRAM data array comprises a plurality of SRAM bit cells organized into a plurality of SRAM bit cell rows and a plurality of SRAM bit cell columns. Each SRAM bit cell of the plurality of SRAM bit cells corresponds to an SRAM bit cell row and an SRAM bit cell column. The SRAM data array further comprises an SRAM strap cell row electrically coupled to the plurality of SRAM bit cell rows. The SRAM strap cell row comprises a plurality of SRAM strap cells, wherein each SRAM strap cell of the plurality of SRAM strap cells corresponds to an SRAM bit cell in each corresponding SRAM bit cell row of the plurality of SRAM bit cell rows. Each SRAM strap cell comprises a substrate, a Pwell tap, and an Nwell tap. The Pwell tap comprises a plurality of Pwell regions each comprising a portion of the substrate doped with a P-type material, and a plurality of supply contacts each electrically coupled to a corresponding Pwell region of the plurality of Pwell regions and a first supply rail. The Nwell tap comprises a plurality of Nwell regions each comprising a portion of the substrate doped with an N-type material, and a plurality of supply contacts each electrically coupled to a corresponding Nwell region of the plurality of Nwell regions and a second supply rail.

In another aspect, an SRAM strap cell is provided. The SRAM strap cell comprises a substrate, a Pwell tap, and an Nwell tap. The Pwell tap comprises a plurality of Pwell regions each comprising a portion of the substrate doped with a P-type material, and a plurality of supply contacts each electrically coupled to a corresponding Pwell region of the plurality of Pwell regions and a first supply rail. The Pwell tap also comprises a plurality of fins formed from the substrate and each corresponding to one Pwell region of the plurality of Pwell regions, and one or more non-active gates. Each non-active gate of the one or more non-active gates is disposed over two or more corresponding fins of the plurality of fins. The Nwell tap comprises a plurality of Nwell regions each comprising a portion of the substrate doped with an N-type material electrically coupled to a second supply rail.

In another aspect, an SRAM data array is provided. The SRAM data array comprises a plurality of SRAM bit cells organized into a plurality of SRAM bit cell rows and a plurality of SRAM bit cell columns. Each SRAM bit cell of the plurality of SRAM bit cells corresponds to an SRAM bit cell row and an SRAM bit cell column. The SRAM data array further comprises an SRAM strap cell row electrically coupled to the plurality of SRAM bit cell rows and comprising a plurality of SRAM strap cells. Each SRAM strap cell of the plurality of SRAM strap cells corresponds to an SRAM bit cell in each corresponding SRAM bit cell row of the plurality of SRAM bit cell rows. Each SRAM strap cell comprises a substrate, a Pwell tap, and an Nwell tap. The Pwell tap comprises a plurality of Pwell regions each comprising a portion of the substrate doped with a P-type material, and a plurality of supply contacts each electrically coupled to a corresponding Pwell region of the plurality of Pwell regions and a first supply rail. The Pwell tap further comprises a plurality of fins formed from the substrate and each corresponding to one Pwell region of the plurality of Pwell regions, and one or more non-active gates. Each non-active gate of the one or more non-active gates is disposed over two or more corresponding fins of the plurality of fins. The Nwell tap comprises a plurality of Nwell regions each comprising a portion of the substrate doped with an N-type material electrically coupled to a second supply rail.

DETAILED DESCRIPTION

Figure 1A:
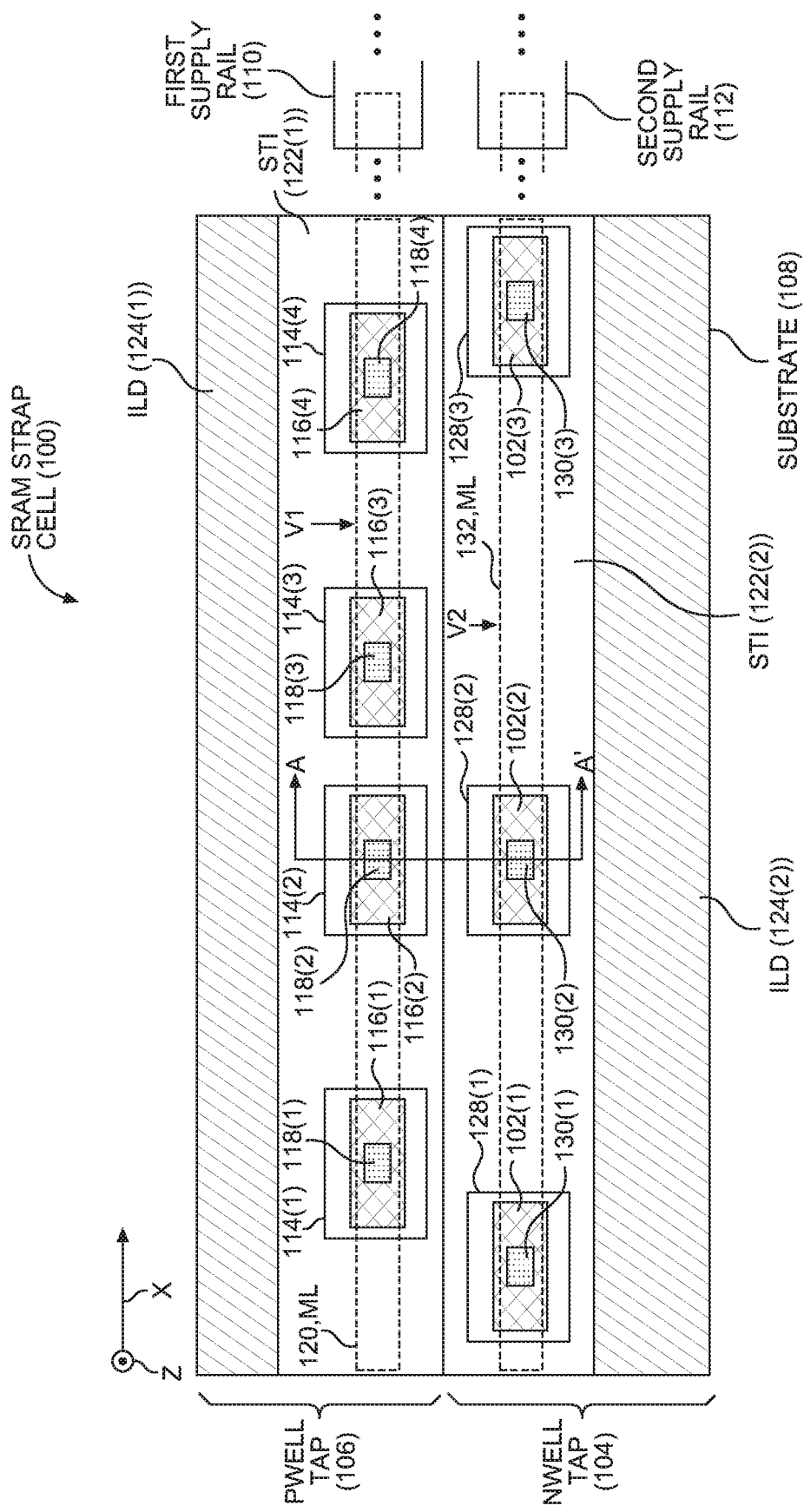
FIG. 1A is a top-view diagram of an exemplary static random access memory (SRAM) strap cell employing multiple supply contacts in an N-type doped well (Nwell) tap to reduce mechanical stress in the SRAM strap cell.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include reducing or avoiding mechanical stress in static random access memory (SRAM) strap cells. For example, SRAM strap cells are employed in an SRAM to evenly distribute charge from power sources to SRAM bit cells. An exemplary SRAM strap cell includes a P-type doped well (Pwell) tap electrically coupled to a first supply rail so as to distribute a first supply voltage (e.g., ground) from the first supply rail to a Pwell region of corresponding SRAM bit cell rows. The SRAM strap cell also includes an N-type doped well (Nwell) tap electrically coupled to a second supply rail so as to distribute a second supply voltage (e.g., Vdd) from the second supply rail to an Nwell region of corresponding SRAM bit cell rows. Although SRAM strap cells can improve charge distribution and storage reliability in an SRAM data array, mechanical stress in conventional SRAM strap cells can result in erroneous operation of an SRAM. For example, mechanical stress in conventional SRAM strap cells can result in stress fields forming in a die on which the SRAM strap cells are fabricated that allows Copper (Cu) to diffuse (i.e., stress-induced diffusion) from the backside of the die so as to create electrical shorts in the SRAM strap cell, which causes errors in the stored data.

Thus, in exemplary aspects disclosed herein, to reduce or avoid the mechanical stress of an SRAM strap cell so as to prevent stress fields within a die on which the SRAM strap cell is fabricated, the Nwell tap of an SRAM strap cell can include multiple supply contacts used to couple the second supply rail to the SRAM strap cell. Employing multiple supply contacts in the Nwell tap can reduce mechanical stress (e.g., tensile stress) in the Nwell tap attributable to the supply contacts compared to a conventional supply contact formed as a single metal line running across the Nwell tap.

In another exemplary aspect that employs Fin Field-Effect Transistor (FET) (FinFET) technology for transistors in SRAM bit cells, the Pwell tap of the SRAM strap cell can include supply contacts disposed over corresponding Fins associated with Pwell regions. To reduce or avoid mechanical stress associated with the Fins of the SRAM strap cell so as to prevent stress fields in the die as described above, the Pwell tap can also include non-active gates disposed across two or more Fins so as to stabilize the Fins and reduce or avoid mechanical stress in the Pwell tap.

Additionally, in another exemplary aspect, an SRAM strap cell may include multiple supply contacts in the Nwell tap, as well as non-active gates in the Pwell tap to reduce or avoid mechanical stress in the SRAM strap cell so as to prevent stress fields in the die as described above. Preventing such stress fields from forming in the die can prevent Copper (Cu) diffusion from the backside of the die, which avoids corresponding electrical shorts in the SRAM strap cell. In this manner, the SRAM strap cell is designed to provide more even charge distribution while avoiding mechanical stress-induced electrical shorts.

Figure 1B:
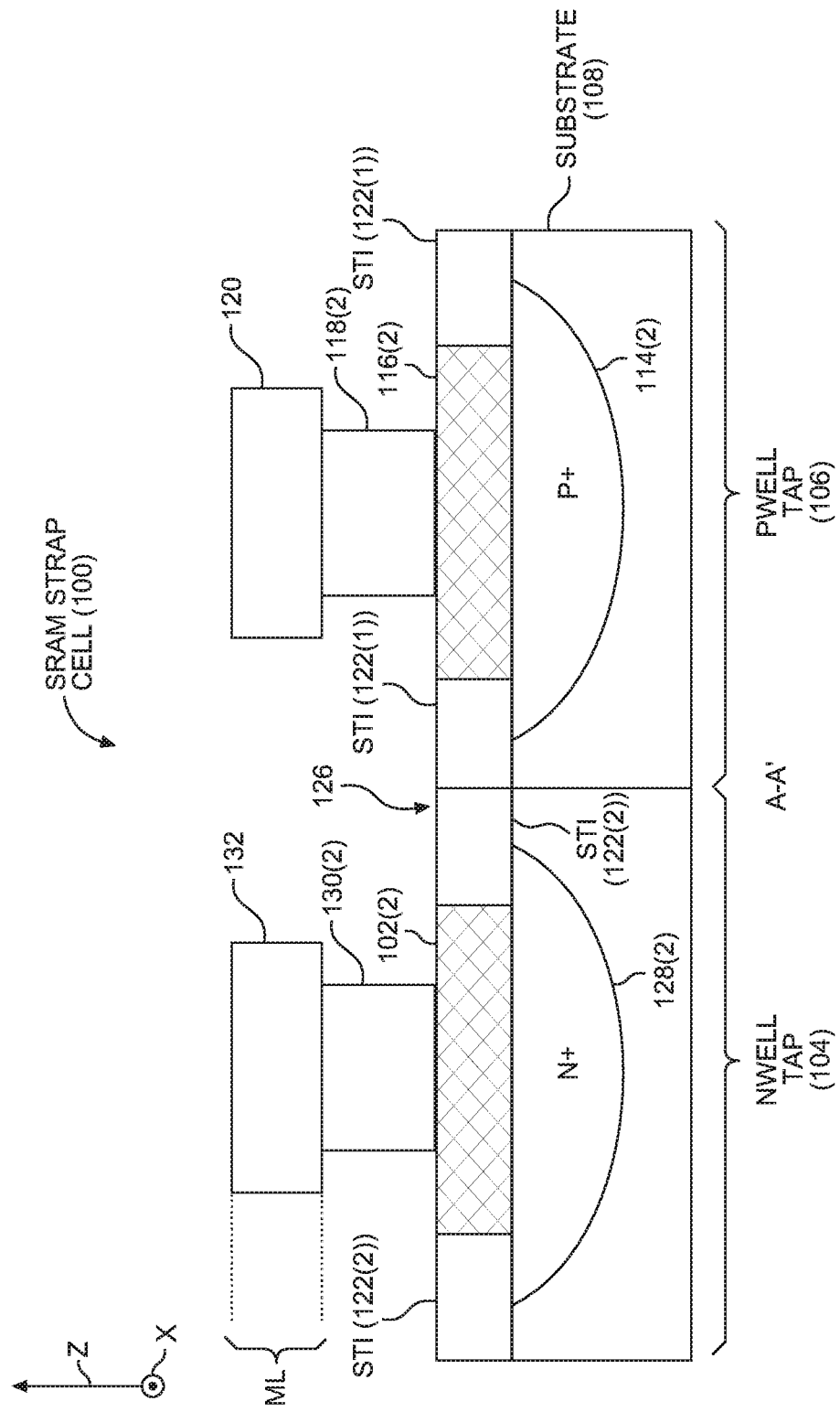
FIG. 1B is a cross-section diagram of the SRAM strap cell of FIG. 1A employing the multiple supply contacts in the Nwell tap to reduce mechanical stress in the SRAM strap cell.

In this regard, FIGS. 1A and 1B illustrate an exemplary SRAM strap cell 100 in planar FET technology employing multiple supply contacts 102(1)-102(3) in an Nwell tap 104 to reduce mechanical stress in the SRAM strap cell 100. FIG. 1A illustrates a top-view diagram of the SRAM strap cell 100. FIG. 1B illustrates a cross-sectional diagram of the SRAM strap cell 100 in FIG. 1A corresponding to line A-A'. Although this aspect includes three (3) supply contacts 102(1)-102(3) in the Nwell tap 104, other aspects may include any number N of supply contacts 102(1)-102(N).

With reference to FIGS. 1A and 1B, the SRAM strap cell 100 may be employed to evenly distribute charge from power sources to SRAM bit cells within a corresponding SRAM. In this regard, the SRAM strap cell 100 includes a Pwell tap 106 and the Nwell tap 104 formed on a substrate 108. The Pwell tap 106 is electrically coupled to a first supply rail 110 so as to distribute a first supply voltage V1 from the first supply rail 110 to a P-type substrate of corresponding SRAM bit cell rows. As a non-limiting example, the first supply rail 110 may be configured to provide a ground voltage (e.g., Vss). On the other hand, the Nwell tap 104 is electrically coupled to a second supply rail 112 so as to distribute a second supply voltage V2 from the second supply rail 112 to an N-type substrate of corresponding SRAM bit cell rows. As a non-limiting example, the second supply rail 112 may be configured to provide a supply voltage (e.g., Vdd). In other aspects, the first supply rail 110 may be configured to provide a supply voltage (e.g., Vdd) and the second supply rail 112 may be configured to provide a ground voltage (e.g., Vss). In other words, if the Nwell tap 104 is electrically coupled so as to receive the supply voltage (Vdd), the Pwell tap 106 is electrically coupled so as to receive the ground voltage (Vss), and vice versa.

With continuing reference to FIGS. 1A and 1B, the Pwell tap 106 employs Pwell regions 114(1)-114(4), each of which includes a portion of the substrate 108 doped with a P-type material. The Pwell tap 106 also includes multiple supply contacts 116(1)-116(4), each of which is electrically coupled to a corresponding Pwell region 114(1)-114(4) and the first supply rail 110. For example, in FIG. 1A, each supply contact 116(1)-116(4) is disposed over the corresponding Pwell region 114(1)-114(4) in a Z-axis direction (Z). Additionally, vias 118(1)-118(4) are disposed over and electrically coupled to the corresponding supply contacts 116(1)-116(4) in the Z-axis direction. A metal line 120 is disposed in a metal layer ML above the supply contacts 116(1)-116(4) and is electrically coupled to the first supply rail 110 and the vias 118(1)-118(4) so as to provide the first supply voltage V1 to the Pwell regions 114(1)-114(4), and thus to the SRAM strap cell 100. For example, the metal line 120 may be employed in a metal zero (M0) layer or metal one (M1) layer. Additionally, the Pwell tap 106 includes a shallow trench isolation (STI) oxide layer 122(1) ("STI 122(1)") and an interlayer dielectric (ILD) oxide layer 124(1) ("ILD 124(1)") employed to level out a top surface 126 of the SRAM strap cell 100 to a height of the supply contacts 102(1)-102(3) and 116(1)-116(4) in the Z-axis direction.

With continuing reference to FIGS. 1A and 1B, the Nwell tap 104 employs Nwell regions 128(1)-128(3), each of which includes a portion of the substrate 108 doped with an N-type material. The Nwell tap 104 also includes the multiple supply contacts 102(1)-102(3), each of which is electrically coupled to a corresponding Nwell region 128(1)-128(3) and the second supply rail 112. For example, in FIG. 1A, each supply contact 102(1)-102(3) is disposed over the corresponding Nwell region 128(1)-128(3) in the Z-axis direction. Additionally, vias 130(1)-130(3) are disposed over and electrically coupled to the corresponding supply contacts 102(1)-102(3) in the Z-axis direction. A metal line 132 is disposed in a metal layer ML above the supply contacts 102(1)-102(3) and is electrically coupled to the second supply rail 112 and the vias 130(1)-130(3) so as to provide the second supply voltage V2 to the Nwell regions 128(1)-128(3). For example, the metal line 132 may be employed in the metal zero (M0) layer or metal one (M1) layer. Additionally, the Nwell tap 104 includes an STI oxide layer 122(2) ("STI 122(2)") and an ILD oxide layer 124(2) ("ILD 124(2)").

With continuing reference to FIGS. 1A and 1B, employing the multiple supply contacts 102(1)-102(3) in the Nwell tap 104 as described above can reduce mechanical stress (e.g., tensile stress) in the Nwell tap 104 attributable to the supply contacts 102(1)-102(3) as compared to a conventional supply contact formed as a single metal line running across an Nwell tap in an X-axis direction. In particular, due to the physical properties of various materials that can be used to fabricate the supply contacts 102(1)-102(3), the relatively high temperature (e.g., 150 degrees Celsius (C)) to which the SRAM strap cell 100 is exposed during fabrication results in higher levels of mechanical stress corresponding to a conventional supply contact compared to the supply contacts 102(1)-102(3). As a non-limiting example, the supply contacts 102(1)-102(3) may be formed from Tungsten (T). In conventional SRAM strap cells that employ a single supply contact spanning the length of the Nwell tap (e.g., a single strip of Tungsten (T)) in the X-axis direction, the mechanical stress resulting from the relatively high temperature can cause enough physical movement of the supply contact such that the physical movement forms stress fields within the substrate 108 (i.e., the corresponding die). These stress fields allow Copper (Cu) to diffuse (i.e., stress-induced diffusion) from the backside of the die so as to create electrical shorts in the SRAM strap cell 100. However, due to the physical properties of Tungsten (T) and other similar materials, the multiple supply contacts 102(1)-102(3) (e.g., multiple shorter strips of Tungsten (T)) that are shorter than the conventional, supply contact in the X-axis direction experience less mechanical stress than the conventional supply contact. Thus, the supply contacts 102(1)-102(3) can reduce the mechanical stress in the Nwell tap 104 compared to conventional SRAM strap cells employing a single supply contact. Reducing or avoiding the mechanical stress of the SRAM strap cell 100 reduces physical movement within the Nwell tap 104, which prevents stress fields from forming within the die on which the SRAM strap cell 100 is fabricated. Preventing such stress fields prevents Copper (Cu) diffusion from the backside of the die, which avoids corresponding electrical shorts in the SRAM strap cell 100. In this manner, the SRAM strap cell 100 is designed to provide more even current distribution while avoiding mechanical stress-induced electrical shorts.

Figure 2:
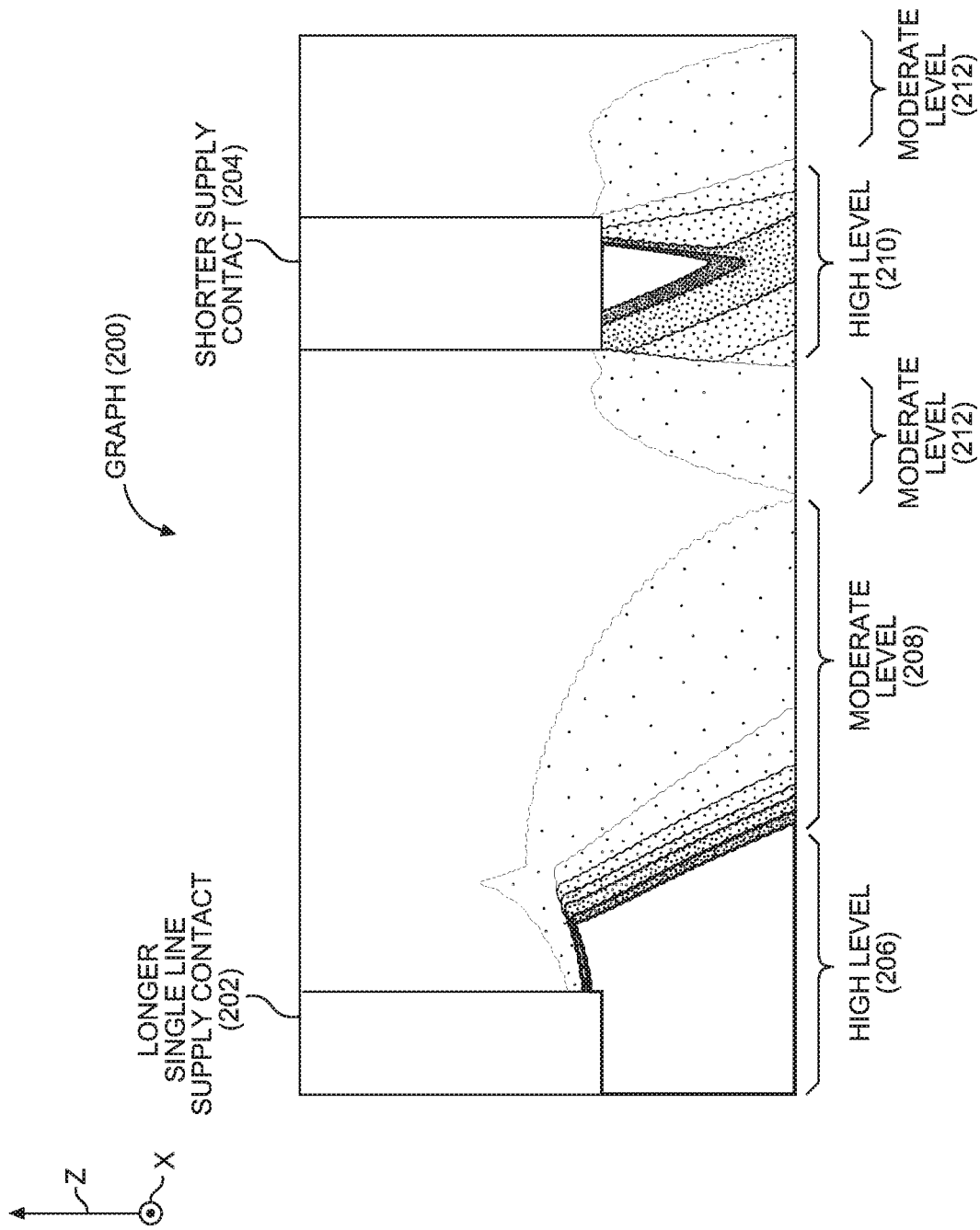
FIG. 2 is a graph illustrating exemplary mechanical stress levels of a conventional supply contact versus a supply contact that is shorter in length than the conventional supply contact in an X-axis direction in an Nwell tap of a simulated SRAM strap cell.

To illustrate the reduction in mechanical stress achieved by employing the multiple supply contacts 102(1)-102(3) in FIGS. 1A and 1B, FIG. 2 is a graph 200 illustrating exemplary mechanical stress levels of a conventional longer single line supply contact 202 versus a shorter supply contact 204 that is shorter than the longer single line supply contact 202 in an X-axis direction in an Nwell tap of a simulated SRAM strap cell. In particular, the graph 200 illustrates a cross-sectional view of a simulated SRAM strap cell and the mechanical stress attributable to the longer single line supply contact 202 and the shorter supply contact 204. In this regard, the graph 200 illustrates that the conventional longer single line supply contact 202 has a corresponding high level 206 of mechanical stress in conjunction with a corresponding moderate level 208 of mechanical stress. However, the graph 200 also illustrates that the shorter supply contact 204 that is shorter than the conventional longer single line supply contact 202 in the X-axis direction has a corresponding high level 210 of mechanical stress that is less than the high level 206 of mechanical stress associated with the conventional longer single line supply contact 202. Additionally, the shorter supply contact 204 has a corresponding moderate level 212 of mechanical stress that is less than the moderate level 208 of mechanical stress associated with the conventional longer single line supply contact 202. In this manner, the simulation represented in the graph 200 demonstrates that the overall mechanical stress of the shorter supply contact 204, such as the supply contacts 102(1)-102(3) in FIGS. 1A and 1B, results in less overall mechanical stress (e.g., the high level 210 and the moderate level 212) at corresponding locations in an Nwell tap of an SRAM strap cell compared to the overall mechanical stress of the conventional longer single line supply contact 202 (e.g., the high level 206 and the moderate level 208).

Figure 3A:
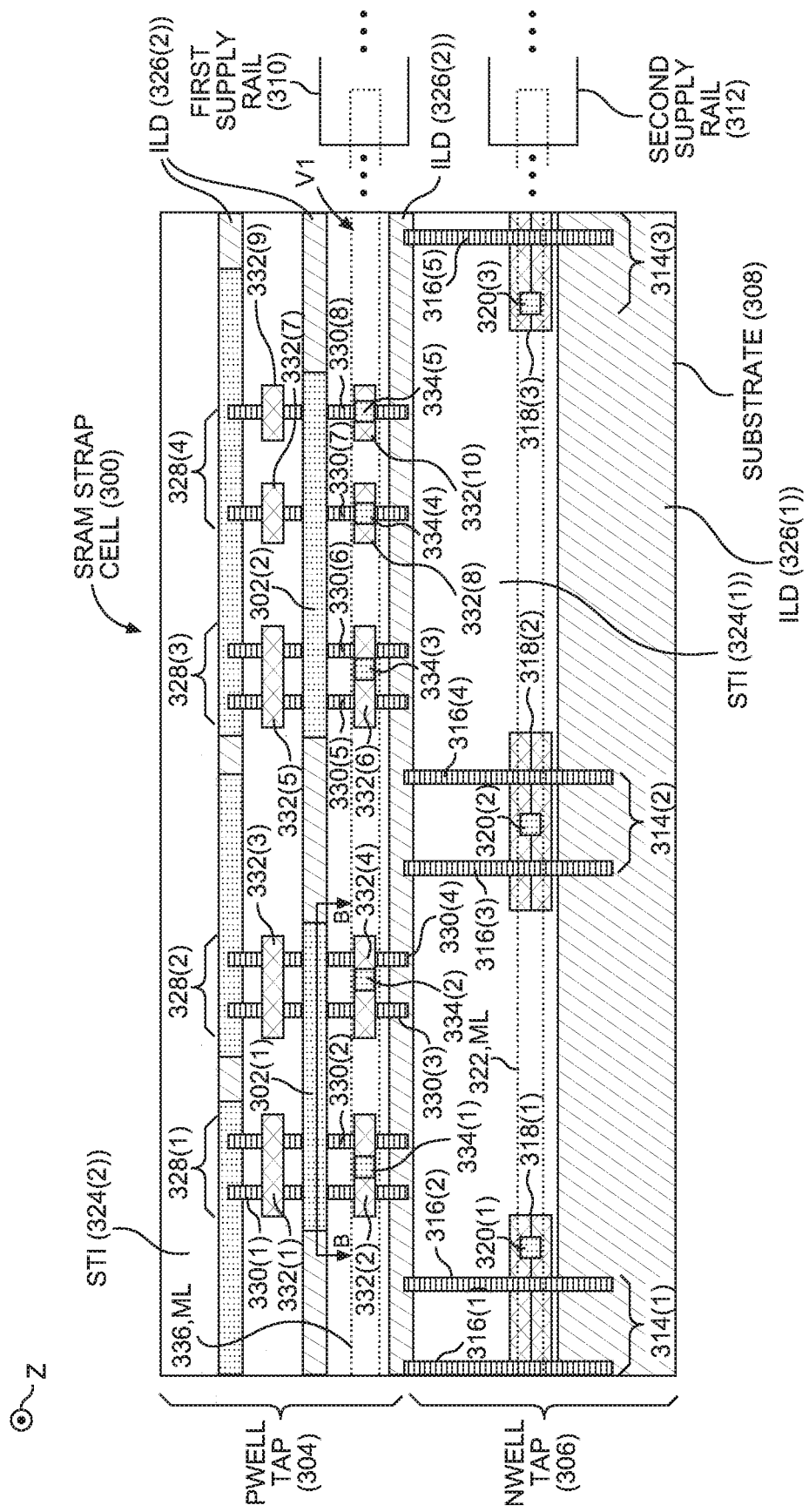
FIG. 3A is a top-view diagram of an exemplary SRAM strap cell employing multiple supply contacts in an Nwell tap and non-active gates disposed over two or more Fins formed in a P-type doped well (Pwell) tap to reduce mechanical stress in the SRAM strap cell.
Figure 3B:
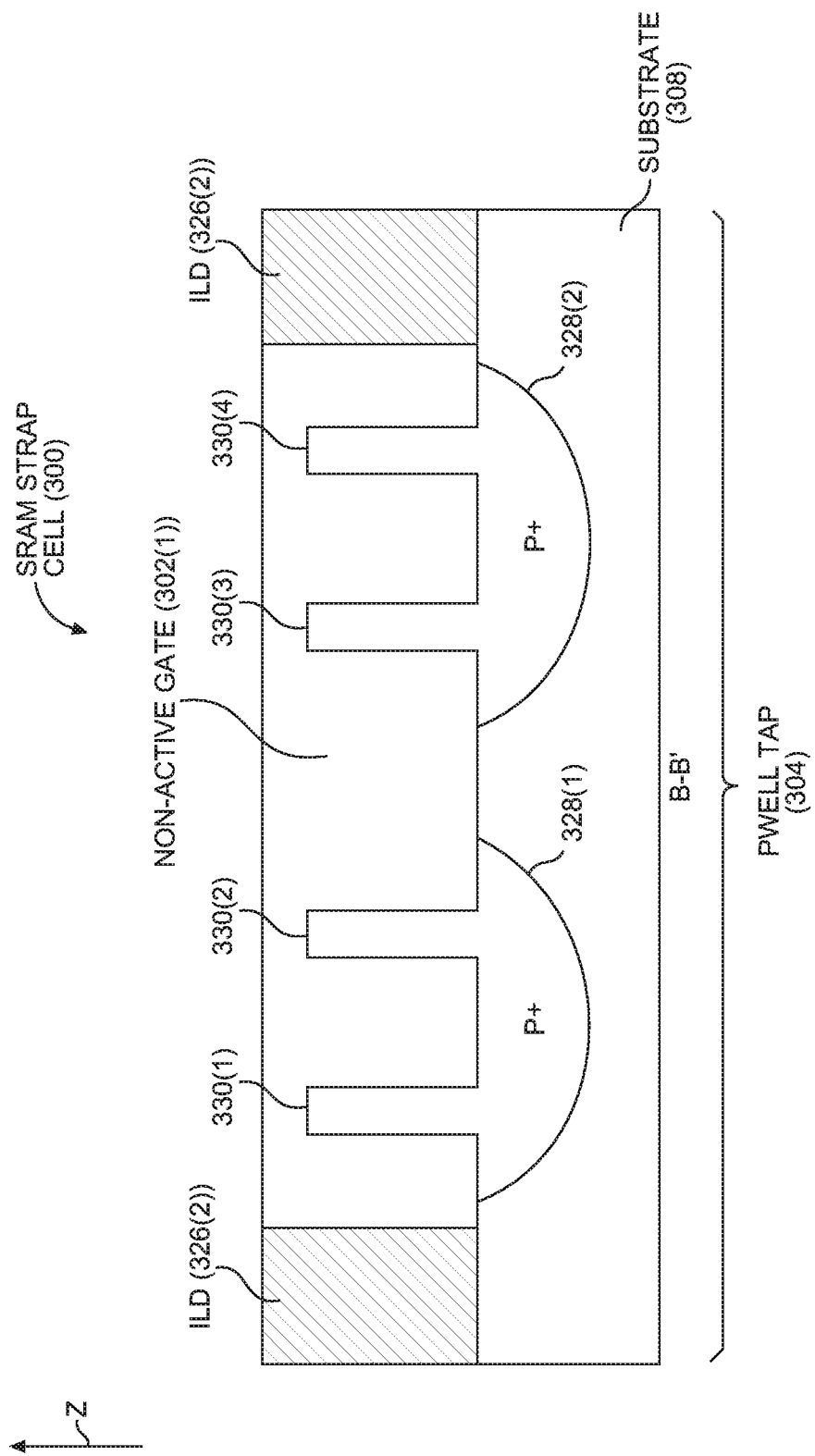
FIG. 3B is a cross-section diagram of the SRAM strap cell of FIG. 3A employing the multiple supply contacts in the Nwell tap and non-active gates disposed over two or more Fins formed in the Pwell tap to reduce mechanical stress in the SRAM strap cell.
Figure 3C:
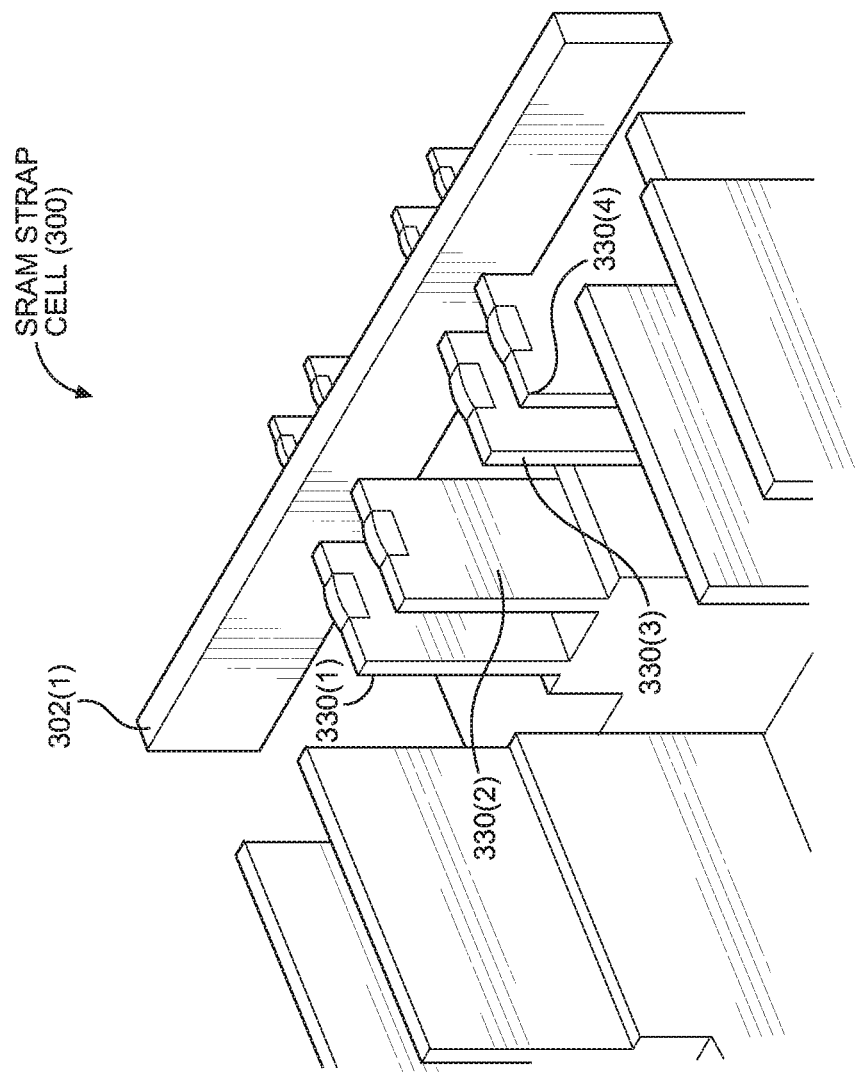
FIG. 3C is a perspective-view diagram of the SRAM strap cell of FIG. 3A employing the multiple supply contacts in the Nwell tap and non-active gates disposed over two or more Fins formed in the Pwell tap to reduce mechanical stress in the SRAM strap cell.
Figure 4:
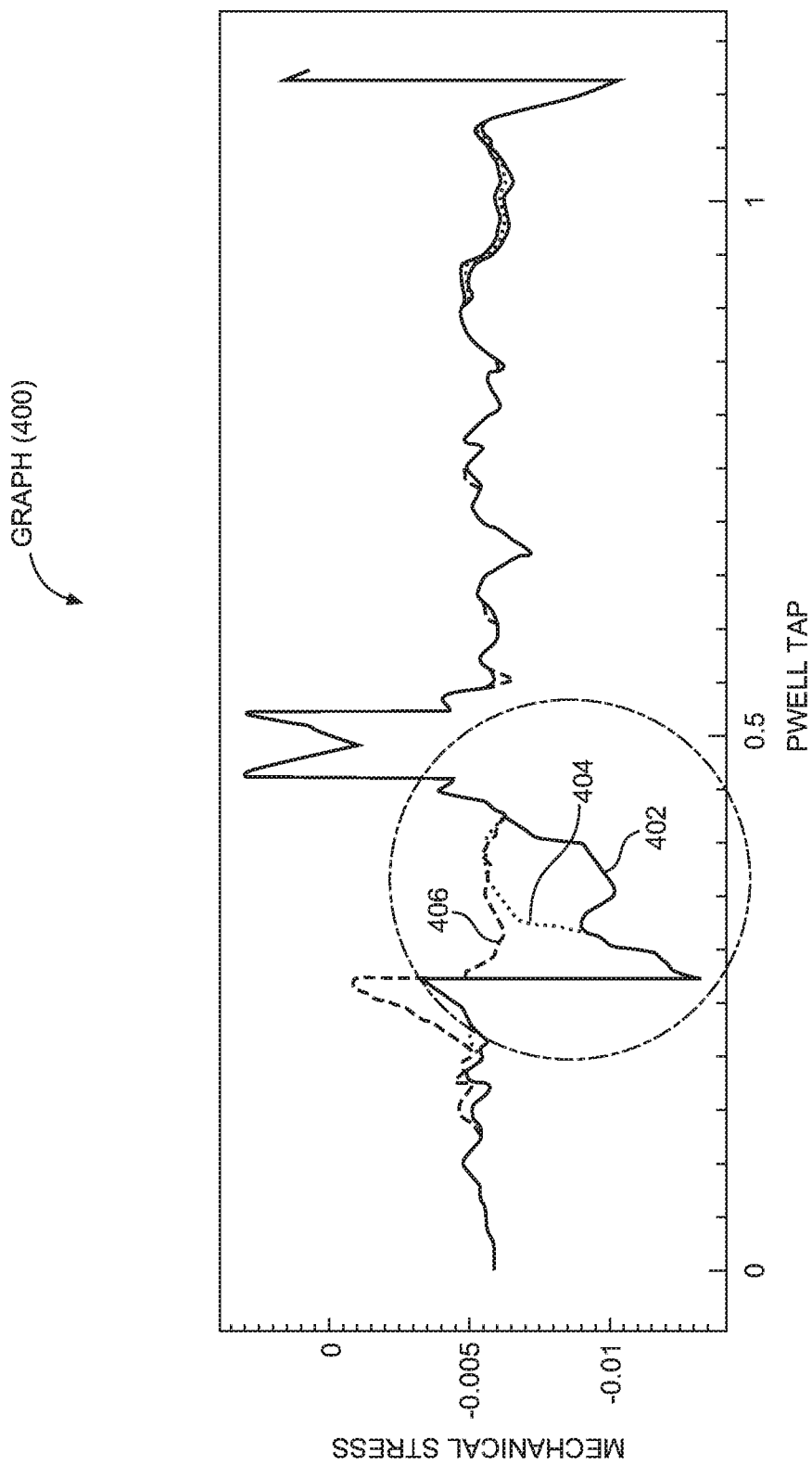
FIG. 4 is a graph illustrating exemplary mechanical stress levels of a Pwell tap that includes zero, one, and two non-active gates in a simulated SRAM strap cell.

In addition to reducing mechanical stress in SRAM strap cells such as the SRAM strap cell 100 in FIGS. 1A and 1B, aspects disclosed herein also reduce mechanical stress in SRAM strap cells employed in FinFET technology. In this regard, FIGS. 3A-3C illustrate an exemplary SRAM strap cell 300 in FinFET technology employing non-active gates 302(1)-302(2) in a Pwell tap 304 to reduce mechanical stress in the SRAM strap cell 300. FIG. 3A illustrates a top-view diagram of the SRAM strap cell 300, FIG. 3B illustrates a cross-sectional diagram of the SRAM strap cell 300 corresponding to line B-B', and FIG. 3C illustrates a perspective-view diagram of the SRAM strap cell 300. Although this aspect includes two (2) non-active gates 302(1)-302(2), other aspects may include any number N of non-active gates 302(1)-302(N).

With reference to FIGS. 3A-3C, the SRAM strap cell 300 includes the Pwell tap 304 and an Nwell tap 306 formed on a substrate 308. The Pwell tap 304 is electrically coupled to a first supply rail 310 so as to distribute a first supply voltage V1 from the first supply rail 310 to a Pwell region of corresponding SRAM bit cell rows. As a non-limiting example, the first supply rail 310 may be configured to provide a ground voltage (e.g., Vss). On the other hand, the Nwell tap 306 is electrically coupled to a second supply rail 312 so as to distribute a second supply voltage V2 from the second supply rail 312 to an Nwell region of corresponding SRAM bit cell rows. As a non-limiting example, the second supply rail 312 may be configured to provide a supply voltage (e.g., Vdd). In other aspects, the first supply rail 310 may be configured to provide a supply voltage (e.g., Vdd) and the second supply rail 312 may be configured to provide a ground voltage (e.g., Vss). In other words, if the Nwell tap 306 is electrically coupled so as to receive the supply voltage (Vdd), the Pwell tap 304 is electrically coupled so as to receive the ground voltage (Vss), and vice versa.

With continuing reference to FIGS. 3A-3C, the Nwell tap 306 employs Nwell regions 314(1)-314(3), each of which includes a portion of the substrate 308 doped with an N-type material. The Nwell tap 306 also includes Fins 316(1)-316 (5) formed from the substrate 308 and that correspond to the Nwell regions 314(1)-314(3). In this example, the Fins 316(1)-316(2) correspond to the Nwell region 314(1), the Fins 316(3)-316(4) correspond to the Nwell region 314(2), and the Fin 316(5) corresponds to the Nwell region 314(3). The Nwell tap 306 also includes the multiple supply contacts 318(1)-318(3), each of which is electrically coupled to the Fins 316(1)-316(5) of the corresponding Nwell region 314 (1)-314(3) and the second supply rail 312. For example, in FIG. 3A, vias 320(1)-320(3) are disposed over and electrically coupled to the corresponding supply contacts 318(1)-318(3) in a Z-axis direction. A metal line 322 is disposed in a metal layer ML above the supply contacts 318(1)-318(3) and is electrically coupled to the second supply rail 312 and the vias 320(1)-320(3) so as to provide the second supply voltage V2 to the Nwell regions 314(1)-314(3). Additionally, the Nwell tap 306 includes an STI oxide layer 324(1) ("STI 324(1)") and an ILD oxide layer 326(1) ("ILD 326 (1)").

With continuing reference to FIGS. 3A-3C, the Pwell tap 304 employs Pwell regions 328(1)-328(4), each of which includes a portion of the substrate 308 doped with a P-type material. The Pwell tap 304 also includes Fins 330(1)-330(8) formed from the substrate 308 and that correspond to the Pwell regions 328(1)-328(4). In this example, the Fins 330(1)-330(2) correspond to the Pwell region 328(1), the Fins 330(3)-330(4) correspond to the Pwell region 328(2), the Fins 330(5)-330(6) correspond to the Pwell region 328(3), and the Fins 330(7)-330(8) correspond to the Pwell region 328(4). The Pwell tap 304 also includes multiple supply contacts 332(1)-332(10), each of which is disposed over the Fins 330(1)-330(8) of the corresponding Pwell region 328(1)-328(4) and electrically coupled to the first supply rail 310. For example, in FIG. 3A, vias 334(1)-334(5) are disposed over and electrically coupled to the corresponding supply contacts 332(1)-332(10). A metal line 336 is disposed in a metal layer ML above the supply contacts 332(2), 332(4), 332(6), 332(8), and 332(10) and is electrically coupled to the first supply rail 310 and the vias 334(1)-334(5) so as to provide the first supply voltage V1 to the Pwell regions 328(1)-328(4). Additionally, the Pwell tap 304 includes an STI oxide layer 324(2) ("STI 324(2)") and an ILD oxide layer 326(2) ("ILD 326(2)").

With continuing reference to FIGS. 3A-3C, the Pwell tap 304 also employs the non-active gates 302(1)-302(2), wherein each of the non-active gates 302(1)-302(2) is disposed over two or more corresponding Fins 330(1)-330(8). As used herein, each non-active gate 302(1)-302(2) does not provide an input value to the corresponding Fins 330(1)-330(8). For example, in FIG. 3A, the non-active gate 302(1) is disposed over the Fins 330(1)-330(4), and the non-active gate 302(2) is disposed over the Fins 330(5)-330(8). As a non-limiting example, the non-active gates 302(1)-302(2) may be formed from polysilicon. In other aspects, the non-active gates 302(1)-302(2) may be formed from other materials, such as metal or other conductive or semi-conductive materials. Employing the non-active gates 302(1)-302(2) as described above can reduce mechanical stress (e.g., tensile stress) in the Pwell tap 304 attributable to the Fins 330(1)-330(8) as compared to a conventional SRAM strap cell not employing the non-active gates 302(1)-302(2). In particular, the SRAM strap cell 300 experiences mechanical stress (e.g., tensile stress) in response to being exposed to relatively high temperatures (e.g., 150 degrees C.) during fabrication. In conventional SRAM strap cells that do not employ the non-active gates 302(1)-302(2), the mechanical stress resulting from the relatively high temperatures can cause physical movement in the Fins 330(1)-330(8), wherein such physical movement can cause stress fields within the corresponding substrate 308 (e.g., the corresponding die). These stress fields allow Copper (Cu) to diffuse (i.e., stress-induced diffusion) from the backside of the die so as to create electrical shorts in the SRAM strap cell 300. However, employing the non-active gates 302(1)-302(2) stabilizes the Fins 330(1)-330(8) so as to prevent mechanical stress from propagating through the Fins 330(1)-330(8). In other words, the non-active gates 302(1)-302(2) provide physical support so as to prevent the Fins 330(1)-330(8) from experiencing the mechanical stress caused by the relatively high temperatures. Reducing or avoiding the mechanical stress of the SRAM strap cell 300 reduces physical movement within the Fins 330(1)-330(8), which prevents stress fields from forming within the die on which the SRAM strap cell 300 is fabricated. Preventing such stress fields prevents Copper (Cu) diffusion from the backside of the die, which avoids corresponding electrical shorts in the SRAM strap cell 300. In this manner, the SRAM strap cell 300 is designed to provide more even current distribution while avoiding mechanical stress-induced electrical shorts.

To illustrate the reduction in mechanical stress achieved by employing the non-active gates 302(1)-302(2) in FIGS. 3A-3C, FIG. 4 is a graph 400 illustrating exemplary mechanical stress levels of a Pwell tap that includes zero, one, and two non-active gates similar to the non-active gates 302(1)-302(2) in FIGS. 3A-3C in a simulated SRAM strap cell. In particular, lines 402, 404, and 406 illustrate the mechanical stress in a Pwell region of an SRAM strap cell when zero, one, and two non-active gates, respectively, are employed over corresponding Fins. The line 402 illustrates that the mechanical stress is highest (e.g., furthest from a zero (0) value) throughout the entire Pwell tap when employing zero non-active gates. However, line 404 demonstrates that the overall mechanical stress is reduced (e.g., closer to the zero (0) value) when one non-active gate is employed. Further, the line 406 illustrates that the overall mechanical stress is even further reduced when two non-active gates are employed (e.g., closest to the zero (0) value). In this manner, the graph 400 illustrates that employing non-active gates such as the non-active gates 302(1)-302(2) helps to stabilize the corresponding Fins so as to reduce the overall mechanical stress in the corresponding Pwell tap of an SRAM strap cell.

Figure 5:
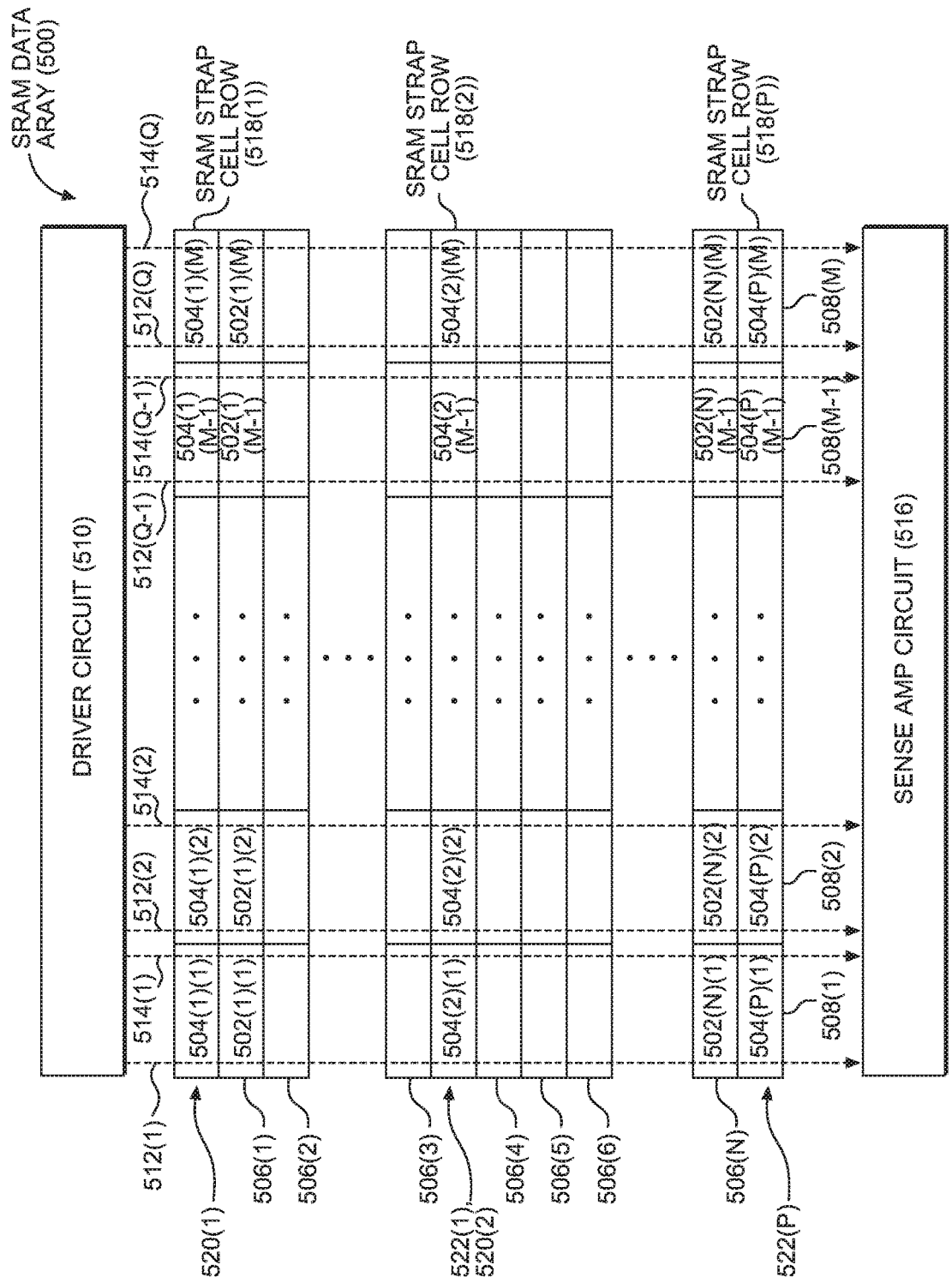
FIG. 5 is a block diagram of an exemplary SRAM employing SRAM bit cells and SRAM strap cells, such as the SRAM strap cells of FIGS. 1A, 1B, and 3A-3C.

FIG. 5 illustrates a block diagram of an exemplary SRAM data array 500 employing SRAM bit cells 502 and SRAM strap cells 504, such as the SRAM strap cells 100, 300 of FIGS. 1A, 1B, and 3A-3C, respectively. In particular, the SRAM data array 500 is organized into SRAM bit cell rows 506(1)-506(N) and SRAM bit cell columns 508(1)-508(M), wherein each SRAM bit cell row 506(1)-506(N) includes an M number of SRAM bit cells 502(1)(1)-502(N)(M). For example, the SRAM bit cell row 506(1) includes the SRAM bit cells 502(1)(1)-502(1)(M). The SRAM data array 500 also includes a driver circuit 510 to drive current over corresponding bit lines 512(1)-512(Q) and complement bit lines 514(1)-514(Q), as well as a sense amp circuit 516 configured to read the stored data in the SRAM bit cells 502(1)(1)-502(N)(M).

With continuing reference to FIG. 5, the SRAM data array 500 also employs SRAM strap cell rows 518(1)-518(P), each of which includes an M number of SRAM strap cells 504(1)(1)-504(P)(M), wherein the SRAM strap cells 504(1)(1)-504(P)(M) can be similar in structure to the SRAM strap cells 100 or 300 in FIGS. 1A, 1B, and 3A-3C, respectively. For example, the SRAM strap cell row 518(1) includes the SRAM strap cells 504(1)(1)-504(1)(M). Further, as a non-limiting example, the SRAM strap cell rows 518(1)-518(P) may be disposed every Q number of SRAM bit cell rows 506(1)-506(N), such as every sixty-four (64) SRAM bit cell rows 506(1)-506(N), to provide more even charge distribution. In this manner, if N is equal to 128, the SRAM strap cell row 518(1) may be configured such that a corresponding Nwell tap 520(1) provides a supply voltage to an N-type substrate of the SRAM bit cells 502(1)(1)-502(64)(M), while the SRAM strap cell row 518(2) may be configured such that a corresponding Pwell tap 522(1) provides a ground voltage to a P-type substrate of the SRAM bit cells 502(1)(1)-502(64)(M). Similarly, the SRAM strap cell row 518(2) may be configured such that a corresponding Nwell tap 520(2) provides the supply voltage to an N-type substrate of the SRAM bit cells 502(65)(1)-502(128)(M), while the SRAM strap cell row 518(P) may be configured such that a corresponding Pwell tap 522(P) provides the ground voltage to a P-type substrate of the SRAM bit cells 502(1)(1)-502(128)(M). In other words, each SRAM strap cell 504(1)(1)-504(P)(M) corresponds to an SRAM bit cell 502(1)(1)-502(128)(M) in each corresponding SRAM bit cell row 506(1)-506(N).

Reducing or avoiding mechanical stress in SRAM strap cells according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
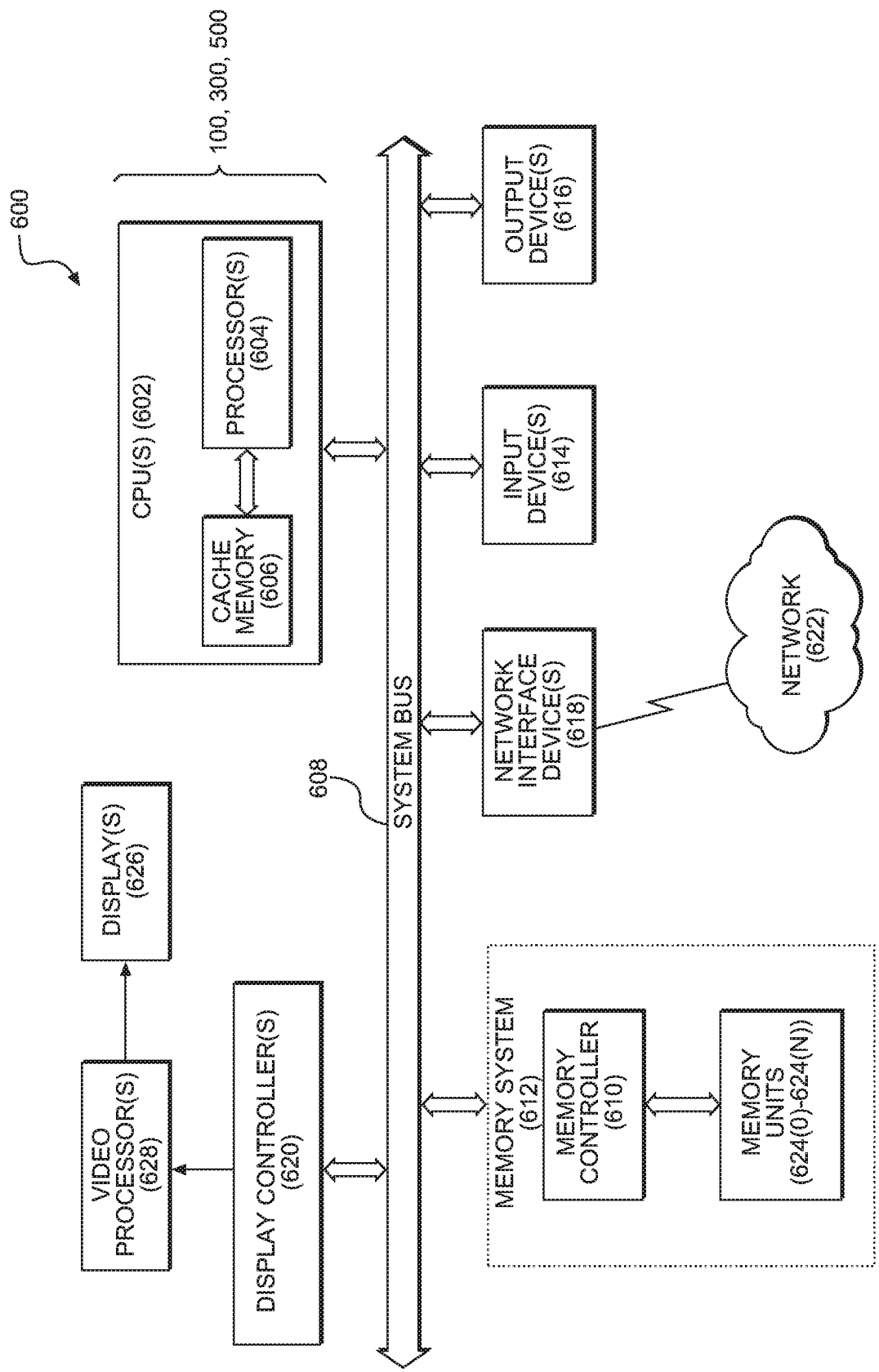
FIG. 6 is a block diagram of an exemplary processor-based system that can include elements employing the SRAM strap cells of FIGS. 1A, 1B, and 3A-3C or the SRAM of FIG. 5 configured to reduce mechanical stress.

In this regard, FIG. 6 illustrates an example of a processor-based system 600 that can include elements employing the SRAM strap cells 100, 300 of FIGS. 1A, 1B, and 3A-3C or the SRAM data array 500 of FIG. 5 configured to reduce mechanical stress. In this example, the processor-based system 600 includes one or more central processing units (CPUs) 602, each including one or more processors 604. The CPU(s) 602 may have cache memory 606 coupled to the processor(s) 604 for rapid access to temporarily stored data. The CPU(s) 602 is coupled to a system bus 608 and can intercouple master and slave devices included in the processor-based system 600. As is well known, the CPU(s) 602 communicates with these other devices by exchanging address, control, and data information over the system bus 608. For example, the CPU(s) 602 can communicate bus transaction requests to a memory controller 610 as an example of a slave device. Although not illustrated in FIG. 6, multiple system buses 608 could be provided, wherein each system bus 608 constitutes a different fabric.

Other master and slave devices can be connected to the system bus 608. As illustrated in FIG. 6, these devices can include a memory system 612, one or more input devices 614, one or more output devices 616, one or more network interface devices 618, and one or more display controllers 620, as examples. The input device(s) 614 can include any type of input device, including, but not limited to, input keys, switches, voice processors, etc. The output device(s) 616 can include any type of output device, including, but not limited to, audio, video, other visual indicators, etc. The network interface device(s) 618 can be any device configured to allow exchange of data to and from a network 622. The network 622 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 618 can be configured to support any type of communications protocol desired. The memory system 612 can include one or more memory units 624(0)-624(N).

The CPU(s) 602 may also be configured to access the display controller(s) 620 over the system bus 608 to control information sent to one or more displays 626. The display controller(s) 620 sends information to the display(s) 626 to be displayed via one or more video processors 628, which process the information to be displayed into a format suitable for the display(s) 626. The display(s) 626 can include any type of display, including, but not limited to, a cathode ray tube (CRT), a liquid crystal display (LCD), a plasma display, a light emitting diode (LED) display, etc.

Figure 7:
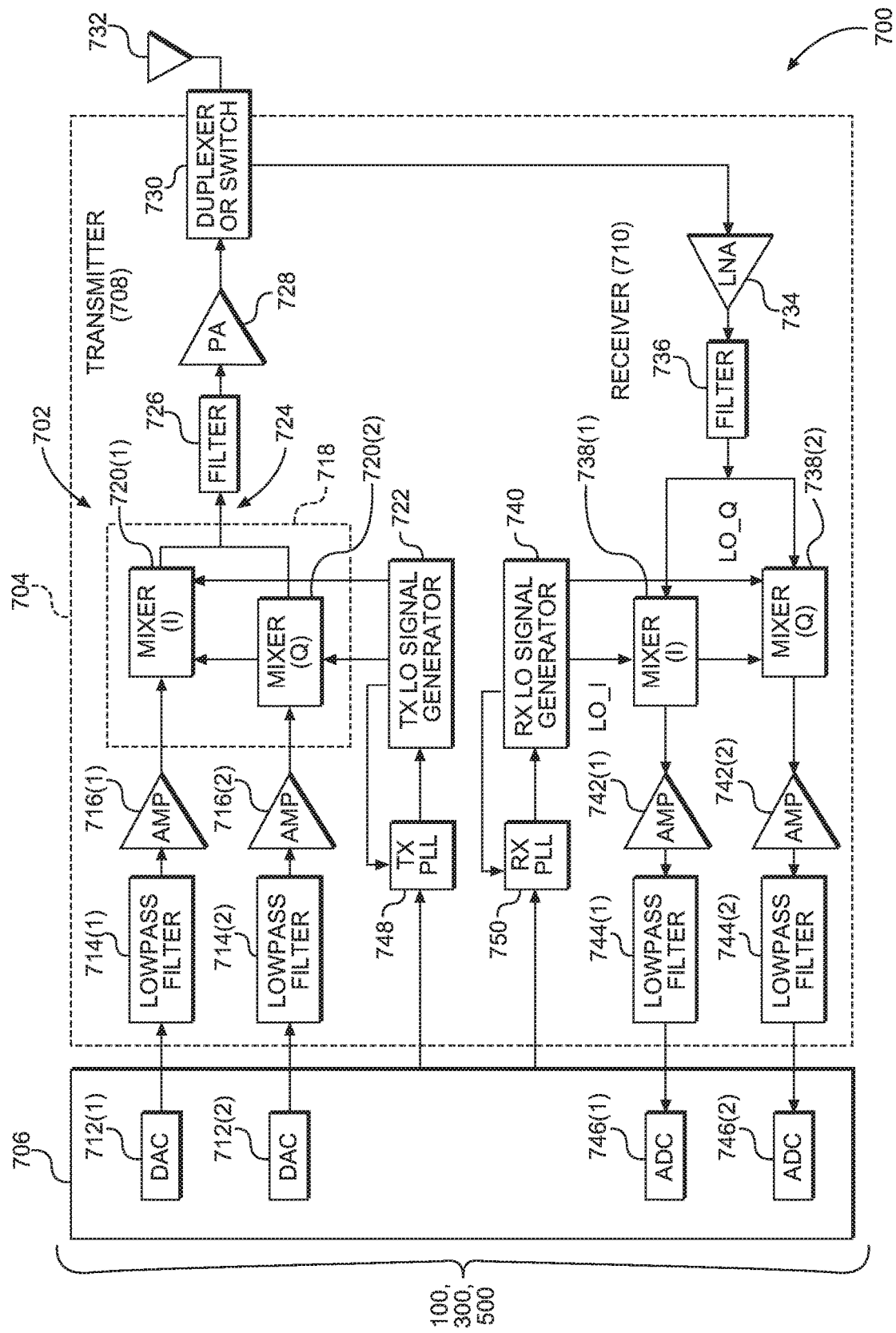
FIG. 7 is a block diagram of an exemplary wireless communications device that includes radio frequency (RF) components formed in an integrated circuit (IC), wherein the RF components can include elements employing the SRAM strap cells of FIGS. 1A, 1B, and 3A-3C or the SRAM of FIG. 5 configured to reduce mechanical stress.

FIG. 7 illustrates an exemplary wireless communications device 700 that includes radio frequency (RF) components formed in an integrated circuit (IC) 702, wherein the RF components can include elements employing the SRAM strap cells 100, 300 of FIGS. 1A, 1B, and 3A-3C or the SRAM data array 500 of FIG. 5 configured to reduce mechanical stress. In this regard, the wireless communications device 700 may be provided in the IC 702. The wireless communications device 700 may include or be provided in any of the above referenced devices, as examples. As shown in FIG. 7, the wireless communications device 700 includes a transceiver 704 and a data processor 706. The data processor 706 may include a memory to store data and program codes. The transceiver 704 includes a transmitter 708 and a receiver 710 that support bi-directional communication. In general, the wireless communications device 700 may include any number of transmitters and/or receivers for any number of communication systems and frequency bands. All or a portion of the transceiver 704 may be implemented on one or more analog ICs, RF ICs (RFICs), mixed-signal ICs, etc.

A transmitter 708 or a receiver 710 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 710. In the direct-conversion architecture, a signal is frequency-converted between RF and baseband in one stage. The super-heterodyne and direct-conversion architectures may use different circuit blocks and/or have different requirements. In the wireless communications device 700 in FIG. 7, the transmitter 708 and the receiver 710 are implemented with the direct-conversion architecture.

In the transmit path, the data processor 706 processes data to be transmitted and provides I and Q analog output signals to the transmitter 708. In the exemplary wireless communications device 700, the data processor 706 includes digital-to-analog-converters (DACs) 712(1), 712(2) for converting digital signals generated by the data processor 706 into the I and Q analog output signals, e.g., I and Q output currents, for further processing.

Within the transmitter 708, lowpass filters 714(1), 714(2) filter the I and Q analog output signals, respectively, to remove undesired signals caused by the prior digital-to-analog conversion. Amplifiers (AMP) 716(1), 716(2) amplify the signals from the lowpass filters 714(1), 714(2), respectively, and provide I and Q baseband signals. An upconverter 718 upconverts the I and Q baseband signals with I and Q transmit (TX) local oscillator (LO) signals through mixers 720(1), 720(2) from a TX LO signal generator 722 to provide an upconverted signal 724. A filter 726 filters the upconverted signal 724 to remove undesired signals caused by the frequency upconversion as well as noise in a receive frequency band. A power amplifier (PA) 728 amplifies the upconverted signal 724 from the filter 726 to obtain the desired output power level and provides a transmit RF signal. The transmit RF signal is routed through a duplexer or switch 730 and transmitted via an antenna 732.

In the receive path, the antenna 732 receives signals transmitted by base stations and provides a received RF signal, which is routed through the duplexer or switch 730 and provided to a low noise amplifier (LNA) 734. The duplexer or switch 730 is designed to operate with a specific receive (RX)-to-TX duplexer frequency separation, such that RX signals are isolated from TX signals. The received RF signal is amplified by the LNA 734 and filtered by a filter 736 to obtain a desired RF input signal. Downconversion mixers 738(1), 738(2) mix the output of the filter 736 with I and Q RX LO signals (i.e., LO_I and LO_Q) from an RX LO signal generator 740 to generate I and Q baseband signals. The I and Q baseband signals are amplified by amplifiers (AMP) 742(1), 742(2) and further filtered by lowpass filters 744(1), 744(2) to obtain I and Q analog input signals, which are provided to the data processor 706. In this example, the data processor 706 includes analog-to-digital-converters (ADCs) 746(1), 746(2) for converting the analog input signals into digital signals to be further processed by the data processor 706.

In the wireless communications device 700 of FIG. 7, the TX LO signal generator 722 generates the I and Q TX LO signals used for frequency upconversion, while the RX LO signal generator 740 generates the I and Q RX LO signals used for frequency downconversion. Each LO signal is a periodic signal with a particular fundamental frequency. A TX phase-locked loop (PLL) circuit 748 receives timing information from the data processor 706 and generates a control signal used to adjust the frequency and/or phase of the TX LO signals from the TX LO signal generator 722. Similarly, an RX PLL circuit 750 receives timing information from the data processor 706 and generates a control signal used to adjust the frequency and/or phase of the RX LO signals from the RX LO signal generator 740.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, a system-on-a-chip (SoC), discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A static random access memory (SRAM) strap cell, comprising:
   a substrate;
   a P-type doped well (Pwell) tap, comprising:
      a plurality of Pwell regions each comprising a portion of the substrate doped with a P-type material, each of the plurality of Pwell regions separated from other Pwell regions among the plurality of Pwell regions by portions of the substrate not doped by the P-type material; and
      a plurality of supply contacts each electrically coupled to a corresponding Pwell region of the plurality of Pwell regions and a first supply rail; and
   an N-type doped well (Nwell) tap, comprising:
      a plurality of Nwell regions each comprising a portion of the substrate doped with an N-type material, each of the plurality of Nwell regions separated from other Nwell regions among the plurality of Nwell regions by portions of the substrate not doped by the N-type material; and
      a plurality of supply contacts each electrically coupled to a corresponding Nwell region of the plurality of Nwell regions and a second supply rail.

2. The SRAM strap cell of claim 1, wherein the Pwell tap further comprises:
   a plurality of fins formed from the substrate, each corresponding to one Pwell region of the plurality of Pwell regions; and
   one or more non-active gates, wherein each non-active gate of the one or more non-active gates is disposed over two or more corresponding fins of the plurality of fins.

3. The SRAM strap cell of claim 2, wherein each non-active gate of the one or more non-active gates is formed from polysilicon.

4. The SRAM strap cell of claim 1, wherein each supply contact of the plurality of supply contacts in the Nwell tap is formed from Tungsten (T).

5. The SRAM strap cell of claim 1, wherein:
   the Pwell tap further comprises:
      a plurality of vias each disposed over and electrically coupled to a corresponding supply contact of the plurality of supply contacts in the Pwell tap; and
      a metal line disposed in a metal layer above the plurality of vias in the Pwell tap, wherein the metal line in the Pwell tap is electrically coupled to the plurality of vias in the Pwell tap and the first supply rail; and
   the Nwell tap further comprises:
      a plurality of vias each disposed over and electrically coupled to a corresponding supply contact of the plurality of supply contacts in the Nwell tap; and
      a metal line disposed in the metal layer above the plurality of vias in the Nwell tap, wherein the metal line in the Nwell tap is electrically coupled to the plurality of vias in the Nwell tap and the second supply rail.

6. The SRAM strap cell of claim 5, wherein the metal layer comprises a metal zero (M0) layer.

7. The SRAM strap cell of claim 1, wherein:
   the first supply rail is configured to provide a ground voltage; and
   the second supply rail is configured to provide a supply voltage.

8. The SRAM strap cell of claim 1 integrated into an integrated circuit (IC).

9. The SRAM strap cell of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

10. A static random access memory (SRAM) data array, comprising:
   a plurality of SRAM bit cells organized into a plurality of SRAM bit cell rows and a plurality of SRAM bit cell columns, wherein each SRAM bit cell of the plurality of SRAM bit cells corresponds to an SRAM bit cell row and an SRAM bit cell column; and
   an SRAM strap cell row electrically coupled to the plurality of SRAM bit cell rows and comprising a plurality of SRAM strap cells, wherein each SRAM strap cell of the plurality of SRAM strap cells corresponds to an SRAM bit cell in each corresponding SRAM bit cell row of the plurality of SRAM bit cell rows and comprises:
      a substrate;
      a P-type doped well (Pwell) tap, comprising:
         a plurality of Pwell regions each comprising a portion of the substrate doped with a P-type material, each of the plurality of Pwell regions separated from other Pwell regions among the plurality of Pwell regions by portions of the substrate not doped by the P-type material; and
         a plurality of supply contacts each electrically coupled to a corresponding Pwell region of the plurality of Pwell regions and a first supply rail; and
      an N-type doped well (Nwell) tap, comprising:
         a plurality of Nwell regions each comprising a portion of the substrate doped with an N-type material, each of the plurality of Nwell regions separated from other Nwell regions among the plurality of Nwell regions by portions of the substrate not doped by the N-type material; and
         a plurality of supply contacts each electrically coupled to a corresponding Nwell region of the plurality of Nwell regions and a second supply rail.

11. The SRAM data array of claim 10, wherein the Pwell tap of each SRAM strap cell further comprises:
- a plurality of fins formed from the substrate and each corresponding to one Pwell region of the one or more Pwell regions; and
- one or more non-active gates, wherein each non-active gate of the one or more non-active gates is disposed over two or more corresponding fins of the plurality of fins.

12. The SRAM data array of claim 10, wherein each supply contact of the plurality of supply contacts in the Nwell tap of each SRAM strap cell is formed from Tungsten (T).

13. The SRAM data array of claim 10, wherein:
the Pwell tap further comprises:
- a plurality of vias each disposed over and electrically coupled to a corresponding supply contact of the plurality of supply contacts in the Pwell tap; and
- a metal line disposed in a metal layer above the plurality of vias in the Pwell tap, wherein the metal line in the Pwell tap is electrically coupled to the plurality of vias in the Pwell tap and the first supply rail; and the Nwell tap further comprises:
- a plurality of vias each disposed over and electrically coupled to a corresponding supply contact of the plurality of supply contacts in the Nwell tap; and
- a metal line disposed in the metal layer above the plurality of vias in the Nwell tap, wherein the metal line in the Nwell tap is electrically coupled to the plurality of vias in the Nwell tap and the second supply rail.

14. The SRAM data array of claim 10, wherein:
the first supply rail is configured to provide a ground voltage; and
the second supply rail is configured to provide a supply voltage.

* * * * *